(12) United States Patent
Chen et al.

(10) Patent No.: US 7,063,246 B2
(45) Date of Patent: Jun. 20, 2006

(54) BRITTLE MATERIAL ROTATING AND ALIGNING MECHANISM FOR USE IN A BRITTLE MATERIAL SCRIBING AND/OR BREAKING APPARATUS

(75) Inventors: Kuei-Jung Chen, Miaoli (TW); Chin-Chong Chiang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/066,429

(22) Filed: Feb. 28, 2005

(65) Prior Publication Data

US 2005/0139047 A1    Jun. 30, 2005

Related U.S. Application Data

(62) Division of application No. 10/358,207, filed on Feb. 5, 2003, now Pat. No. 6,892,917.

(30) Foreign Application Priority Data

Nov. 18, 2002  (TW) .............................. 91218527 U

(51) Int. Cl.
 *B26D 3/08* (2006.01)

(52) U.S. Cl. ........................ 225/96.5; 225/103; 225/93; 125/23.01; 83/879

(58) Field of Classification Search .......... 83/879–887, 83/35, 36, 43; 225/93, 94, 96, 104; 125/23.01, 125/23.02, 15, 13.01, 35, 12, 901; 29/417, 29/413, 414; 33/568, 573, 569, 18.1; 74/63
See application file for complete search history.

(56) References Cited

U.S. PATENT DOCUMENTS

| | | | |
|---|---|---|---|
| 2,631,909 A | 3/1953 | Williams | 108/104 |
| 3,608,909 A | 9/1971 | Rabinow | 369/270 |
| 4,056,075 A * | 11/1977 | Seiderman | 118/696 |
| 4,328,553 A | 5/1982 | Fredriksen et al. | 356/139.04 |
| 4,604,910 A | 8/1986 | Chadwick et al. | 74/96 |
| 4,653,680 A | 3/1987 | Regan | 225/104 |
| 5,656,082 A | 8/1997 | Takatsuki et al. | 118/52 |
| 5,820,006 A | 10/1998 | Turner | 225/96 |
| 6,142,138 A | 11/2000 | Azuma et al. | 125/14 |
| 6,164,894 A | 12/2000 | Cheng | 414/416.03 |
| 6,205,994 B1 | 3/2001 | Freund et al. | 125/23.01 |
| 2002/0011479 A1 | 1/2002 | Narita et al. | 219/390 |
| 2003/0211813 A1 | 11/2003 | Kassir et al. | 451/28 |
| 2004/0080730 A1 | 4/2004 | Binnard | 355/53 |
| 2005/0059519 A1* | 3/2005 | Brandsma et al. | 474/242 |

* cited by examiner

*Primary Examiner*—Allan N. Shoap
*Assistant Examiner*—Omar Flores Sanchez
(74) *Attorney, Agent, or Firm*—Rabin & Berdo, P.C.

(57) ABSTRACT

A brittle material rotating and aligning mechanism including a bearing, a rotary table, and a driving mechanismU, and installed in the worktable of a brittle material scribing and breaking apparatus; carries brittle material, for example, a semiconductor wafer for scribing and breaking into individual dies. The driving mechanism uses a flexible transmission member to rotate the rotary table for low installation cost, no requirement for a precision adjustment during installation, and, preventing the occurrence of back lash or the production of particles due to friction between the transmission member and the driving wheel of the driving mechanism, or between the transmission member and the rotary table.

2 Claims, 4 Drawing Sheets

BRITTLE MATERIAL ROTATING AND ALIGNING MECHANISM FOR USE IN A BRITTLE MATERIAL SCRIBING AND/OR BREAKING APPARATUS

CROSS-REFERENCE TO RELATED APPLICATION

This application is a divisional of application Ser. No. 10/358,207, filed Feb. 5, 2003 now U.S. Pat. No. 6,892,917, and the right of priority of parent application is and was claimed under 35 USC §119 of Taiwanese Application No. 91218527, filed Nov. 18, 2002.

BACKGROUND OF THE INVENTION

1. Field of the Invention

The present invention relates to a brittle material rotating and aligning mechanism and more particularly to such a brittle material rotating and aligning mechanism, which is practical for use in a brittle material scribing and breaking apparatus to carry the workpiece for scribing and breaking into individual pieces.

2. Description of Related Art

In semiconductor foundries, high precision apparatus are needed for high precision production without producing much amount of particles. A regular wafer scribing and/or breaking apparatus, for example, the apparatus disclosed in U.S. Pat. No. 5,820,006, uses gears to form a transmission mechanism for rotating the loaded semiconductor wafer for scribing and breaking. Because gears are rough devices, backlash tends to occur during engaging action between two gears. When this backlash problem occurred, it affects the precision of the wafer scribing and/or breaking apparatus. Further, the engaging action between two gears may produce particles due to friction resistance. Particles are harmful to semiconductor wafers.

Therefore, it is desirable to provide a brittle material rotating and aligning mechanism that eliminates the aforesaid drawbacks.

SUMMARY OF THE INVENTION

It is the main object of the present invention to provide a brittle material rotating and aligning mechanism, which fixes a flexible transmission member to a rotary table for enabling the rotary table to be rotated by the flexible transmission member to carry the workpiece on the rotary table to the desired angle for scribing/breaking. For the advantages of low installation cost and no requirement for a precision adjustment during installation and, for the effect of preventing the occurrence of backlash or the production of particles during operation, the flexible transmission member is the best choice.

To achieve this and other objects of the present invention, the brittle material rotating and aligning mechanism is comprised of a bearing, a rotary table, and a driving mechanism. The bearing comprises a first annular bearing element fixedly fastened to a worktable of a brittle material scribing and/or breaking apparatus, a second annular bearing element supported on the first annular bearing element, and a supplementary annular bearing element coaxially and fixedly fastened to the second annular bearing element to secure the second annular bearing element to the first annular bearing element and for enabling the second annular bearing element and the supplementary annular bearing element to be rotated relative to the first annular bearing element. The rotary table is fixedly mounted on the second annular bearing element of the bearing, and the rotary table has a peripheral wall. The driving mechanism comprises a flexible transmission member mounted on the peripheral wall of the rotary table, a driving wheel engaged with the flexible transmission member, and a motor adapted to drive the driving wheel to rotate the flexible transmission mechanism and the rotary table. Because the present invention uses a flexible transmission member to rotate the rotary table, which carries the workpiece (semiconductor wafer), and because the transmission member used is flexible and fixedly fastened to the rotary table, the present invention eliminates the occurrence of back lash and the production of particles due to friction between the transmission member and the driving wheel or rotary table. Further, the flexible transmission member is inexpensive to manufacture and easy to install. During installation of the flexible transmission member, no precision adjustment is needed.

The second annular bearing element and the supplementary annular bearing element are fixedly fastened together by screws, defining an endless groove. The first annular bearing element has a flange extended along the inner diameter thereof and inserted in the endless groove to support the second annular bearing element and the supplementary annular bearing element to be rotated relative to the first annular bearing element. This structure of bearing is a sliding bearing. Alternatively, a ball bearing or needle bearing may be used instead of the sliding bearing. Further, a lubricating layer may be provided in between the endless groove and the flange of the first annular bearing element.

At least one fastening means may be used to fix the flexible transmission member to the peripheral wall of the rotary table. The flexible transmission member can be a timing belt. Alternatively, a chain transmission mechanism may be used instead of a timing belt. Further, a tension wheel may be provided to control the tension of the flexible transmission member.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
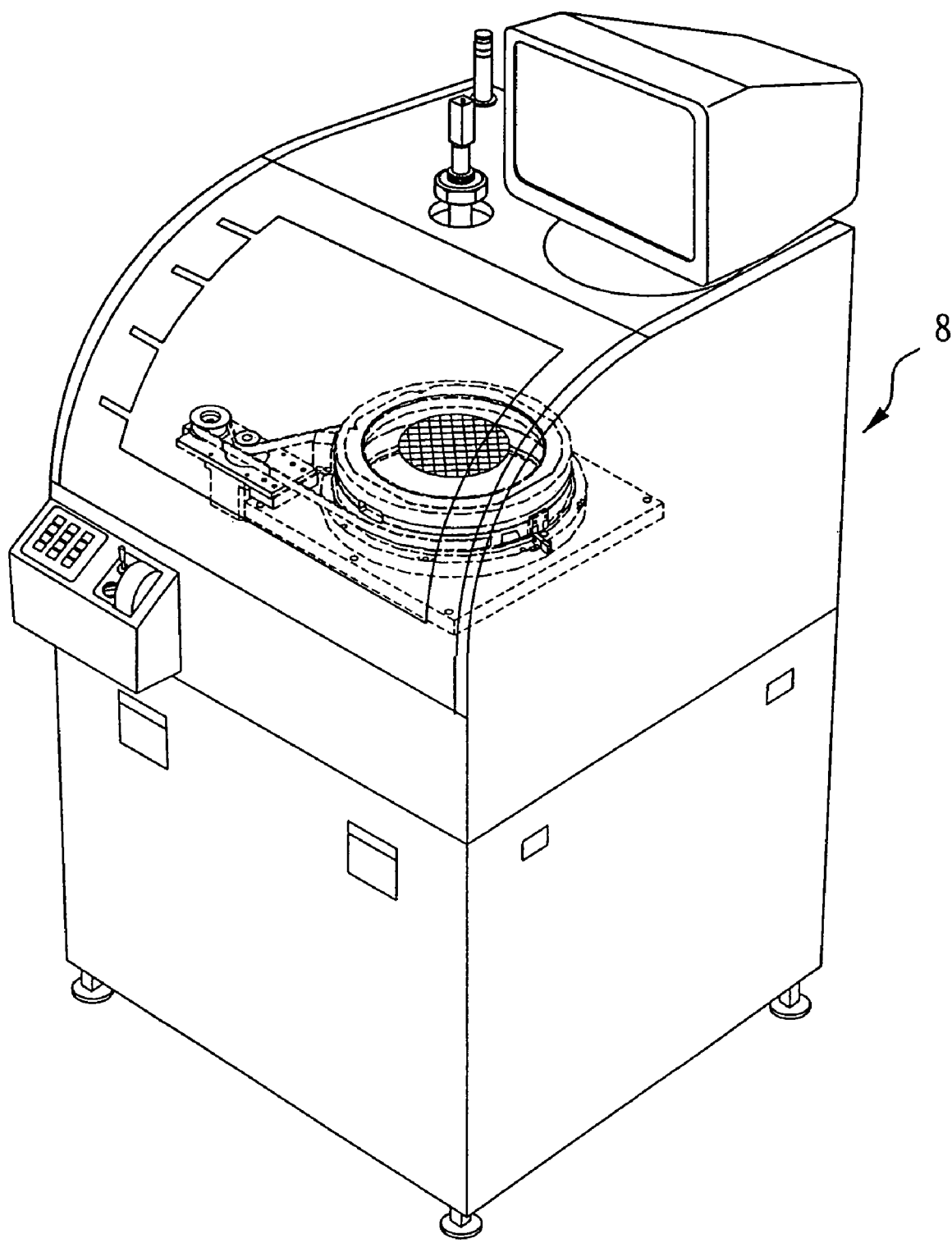
FIG. 1 illustrates a brittle material rotating and aligning mechanism installed in a wafer scribing and breaking apparatus according to the present invention.

With reference to FIG. 1, a brittle material rotating and aligning mechanism is shown installed in a wafer scribing and breaking apparatus 8.

Figure 2:
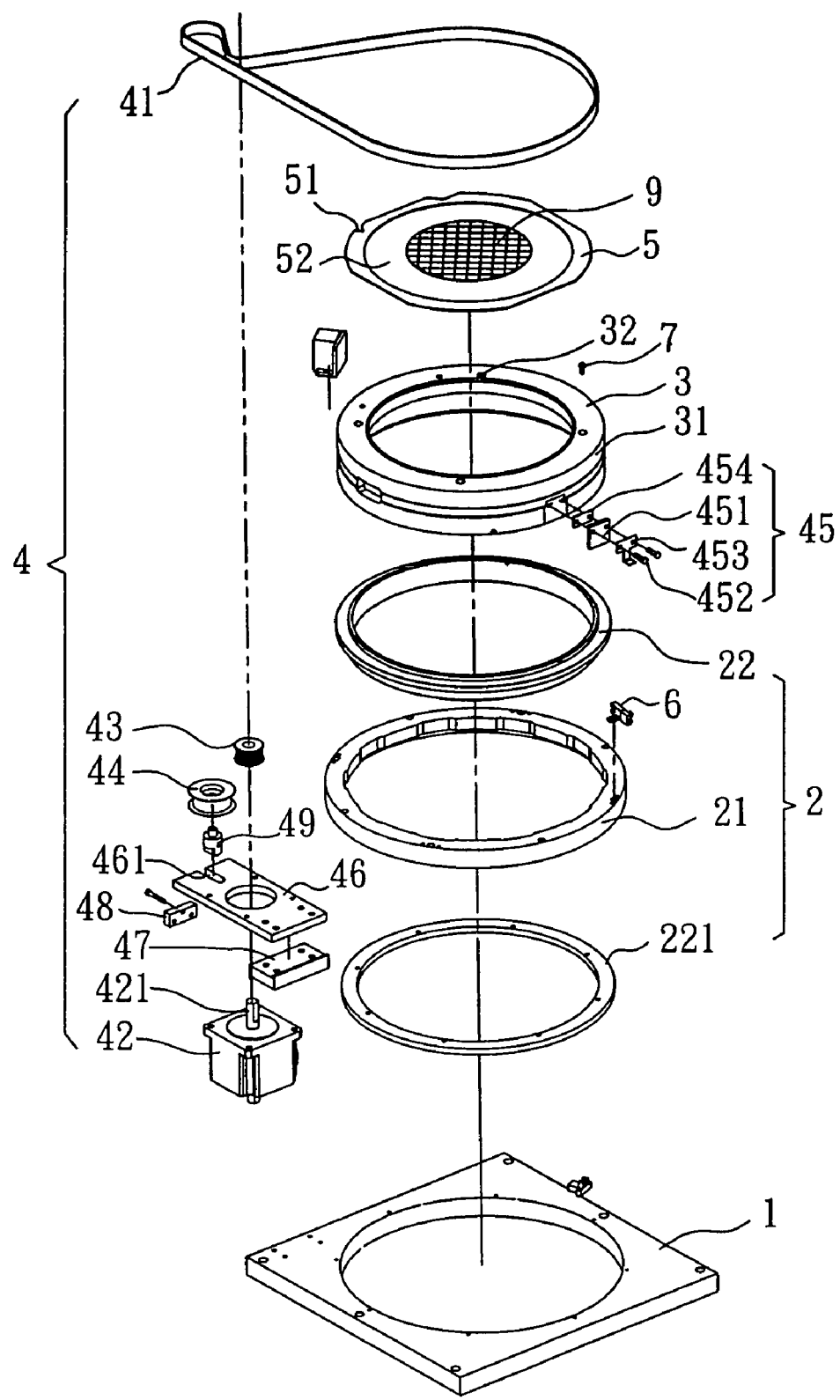
FIG. 2 is an exploded view of the brittle material rotating and aligning mechanism according to the present invention.

With reference to FIG. 2, the aforesaid brittle material rotating and aligning mechanism is comprised of a bearing 2, a rotary table 3, and a driving mechanism 4.

Figure 3:
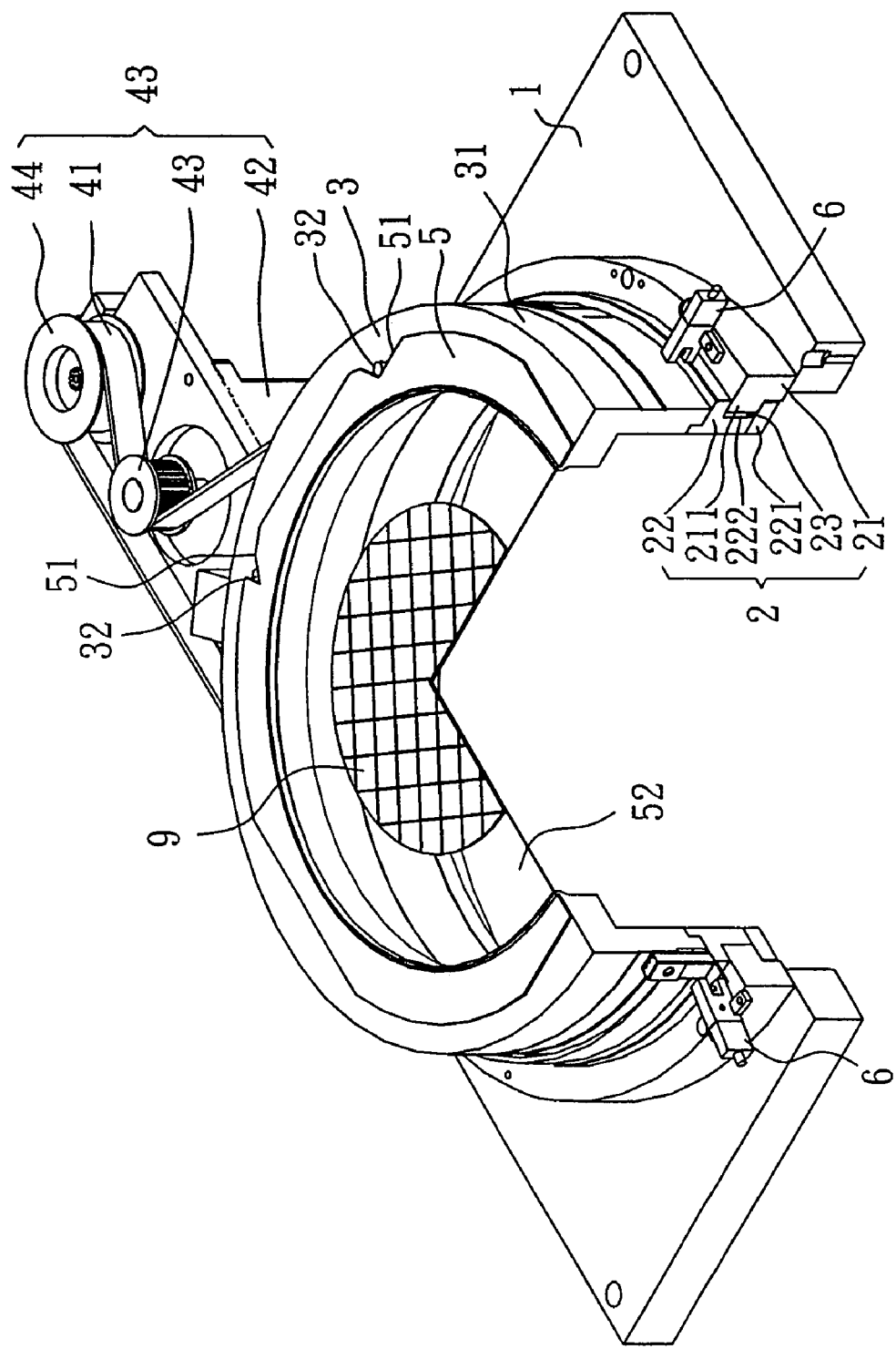
FIG. 3 is a section view of the rotary table and the bearing according to the present invention.

Referring to FIG. 3 and FIGS. 1 and 2 again, the bearing 2 comprises a first annular bearing element 21 fixedly fastened to the top of the worktable 1 of a wafer scribing and breaking apparatus 8 by screws (not shown), the first annular bearing element 21 having a flange 211 extended along the inner diameter, a second annular bearing element 22 coaxially mounted on the first annular bearing element 21, a supplementary annular bearing element 221 fixedly fastened to the bottom side of the second annular bearing element 22 by screws (not shown) and defining with the second annular bearing element 22 an endless groove 222, which receives and supports the flange 211 of the first annular bearing element 21, for enabling the second annular bearing element 22 and the supplementary annular bearing element 221 to be rotated relative to the first annular bearing element 21. In order to smoothen the rotary motion of the second annular bearing element 22 and the supplementary annular bearing element 221 relative to the first annular bearing element 21, a lubricating layer 23 is formed in between the endless groove 222 and the flange 211. According to this embodiment, the bearing 2 is a sliding bearing. Alternatively, a ball bearing, needle bearing, or any suitable equivalent bearing may be used.

The rotary table 3 is fixedly fastened to the second annular bearing element 22 of the bearing 2 by screws 7, and driven by the driving mechanism 4 to rotate relative to the first annular bearing element 21. The driving mechanism 4 comprises a flexible transmission member 41, a motor 42, a driving wheel 43, and a tension wheel 44. According to this embodiment, the flexible transmission member 41 is a timing belt. Alternatively, a chain belt or the like may be used instead of the timing belt. The motor 42 is fixedly mounted in a motor mount 46, which is fixedly fastened to the worktable 1 with a connecting plate 47. The driving wheel 43 is fastened to the output shaft 421 of the motor 42. The motor mount 46 has an elongated sliding slot 461. An axle 49 is inserted through the elongated sliding slot 461. The tension wheel 44 is mounted on the axle 49. A lock 48 is provided for locking the axle 49 on the motor mount 46. When the lock 48 unlocked, the tension wheel 44 can be moved with the axle 49 along the elongated sliding slot 461 to adjust the tension of the flexible transmission member 41. The flexible transmission member 41 is mounted on the periphery wall 31 of the rotary table 3. A fastening means 45 is provided to hold down the flexible transmission member 41 on the periphery wall 31 of the rotary table 3. The fastening means 45 is comprised of a front packing strip 453, a clamp plate 451, and a rear packing strip 454. The clamp plate 451 is used to hold down the flexible transmission member 41 at first. If the width of the flexible transmission member 41 is narrow, the rear packing strip 454 is placed on the top of the flexible transmission member 41, and then a screw 452 is installed to fix the front packing strip 453, the clamp plate 451, the rear packing strip 454 and the flexible transmission member 41 together, keeping the flexible transmission member 41 fixedly secured to the periphery wall 31 of the rotary table 3. Thus, the flexible transmission member 41 can be driven to rotate the rotary table 3. After installation of the flexible transmission member 41 in the periphery wall 31 of the rotary table 3, a part of the flexible transmission member 41 is wound round the tension wheel 44 for adjusting the tension of the flexible transmission member 41 and extended over the driving wheel 43.

Further, a workpiece holder 5 is located on the rotary table 3 to hold a brittle material, for example, a semiconductor wafer 9. The workpiece holder 5 is a ring member having a rubber film 52 stretched therein. The semiconductor wafer 9 is attached to the rubber film 52. When the semiconductor wafer 9 cut into individual dies, the individual dies thus obtained are adhered to the rubber film 52. The workpiece holder 5 has two locating notches 51 in the periphery. The rotary table 3 has two locating pins 32 corresponding to the locating notches 51 of the workpiece holder 5. During installation, the workpiece holder 5 is attached to the rotary table 3, keeping the locating notches 51 respectively secured to the locating pins 32, and then a vacuum suction force or magnetic attraction force is applied to fix the workpiece holder 5 to the rotary table 3.

Figure 4:
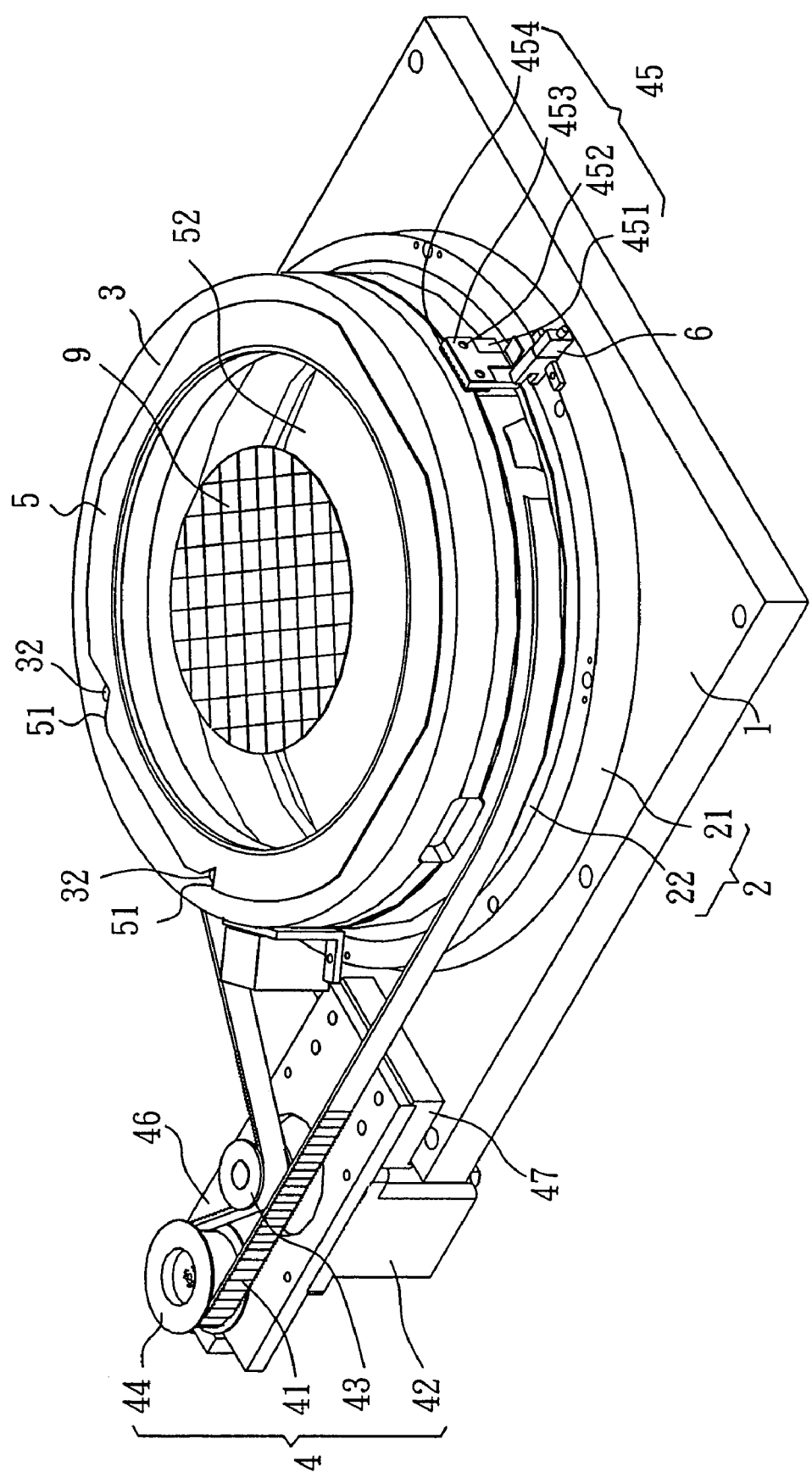
FIG. 4 is an assembly view of the present invention.

Referring to FIG. 4, when the motor 42 started, the driving wheel 43 is rotated with the output shaft 421 of the motor 42 to move the flexible transmission member 41, thereby causing the rotary table 3 to be rotated, and therefore the semiconductor 9 is moved with the workpiece holder 5 to the aligned position for scribing and/or breaking. According to this embodiment, the angle of rotation of the rotary table 3 is effectively controllable. The front packing strip 453 is made having a L-shaped profile. At least two sensors 6 are installed in the first annular bearing element 21 of the bearing 2 and adapted to detect the position of the L-shaped front packing strip 453 indicative of the angle of rotation of the rotary table 3. Alternatively, the sensors 6 can be installed in the worktable 1 or other suitable locations. The sensors 6 can be optics sensors, or limit switches. According to this embodiment, the sensors 6 are optics sensors and the range of the sensing angle is 90°±10°.

As indicated above, the present invention uses a flexible transmission member 41 to rotate the rotary table 3, which carries the workpiece (semiconductor wafer) 9. Because the flexible transmission member 41 is flexible and fixedly fastened to the rotary table 3, the present invention eliminates the occurrence of back lash or the production of particles due to friction between the flexible transmission member 41 and the driving wheel 43 or rotary table 3. Further, the flexible transmission member 41 is inexpensive to manufacture and easy to install. During installation of the flexible transmission member 41, no precision adjustment is needed Although the present invention has been explained in relation to its preferred embodiment, it is to be understood that many other possible modifications and variations can be made without departing from the spirit and scope of the invention as hereinafter claimed.

What is claimed is:

1. A brittle material rotating and aligning mechanism, comprising:

a bearing, said bearing comprising a first annular bearing element fixedly fastened to a worktable of a brittle material scribing and breaking apparatus, a second annular bearing element supported on said first annular bearing element, and a supplementary annular bearing element coaxially and fixedly fastened to said second annular bearing element to secure said second annular bearing element to said first annular bearing element and for enabling said second annular bearing element and said supplementary annular bearing element to be rotated relative to said first annular bearing element;

a rotary table fixedly mounted on said second annular bearing element of said bearing, said rotary table having a peripheral wall; and a driving mechanism adapted to rotate said rotary table, said driving mechanism comprising a flexible transmission member mounted on the peripheral wall of said rotary table, a driving wheel engaged with said flexible transmission member, and a motor adapted to drive said driving wheel to rotate said flexible transmission mechanism and said rotary table, wherein said driving mechanism further comprises at least one fastening means adapted to fix said flexible transmission member to the peripheral wall of said rotary table; and wherein said fastening means comprises a front packing strip, a rear packing strip, a clamp plate sandwiched in between said front packing strip and said rear packing strip, and a plurality of screws fixing said front packing strip, said rear packing strip, said clamp plate and said flexible transmission member to the peripheral wall of said rotary table.

2. The brittle material rotating and aligning mechanism as claimed in claim 1, wherein said front packing strip has a L-shaped profile; said rotating and aligning mechanism further comprises at least two sensors adapted to detect the position of said L-shaped front packing strip for controlling the angle of rotation of said rotary table.

* * * * *